United States Patent
Inagaki

(10) Patent No.: US 9,270,245 B2
(45) Date of Patent: Feb. 23, 2016

(54) SOUND OUTPUT SYSTEM, NON-TRANSITORY COMPUTER-READABLE STORAGE MEDIUM HAVING SOUND OUTPUT PROGRAM STORED THEREON, SOUND OUTPUT CONTROL METHOD, AND INFORMATION PROCESSING APPARATUS

(71) Applicant: NINTENDO CO., LTD., Kyoto (JP)

(72) Inventor: Yoji Inagaki, Kyoto (JP)

(73) Assignee: NINTENDO CO., LTD., Kyoto (JP)

( * ) Notice: Subject to any disclaimer, the term of this patent is extended or adjusted under 35 U.S.C. 154(b) by 422 days.

(21) Appl. No.: 13/868,683

(22) Filed: Apr. 23, 2013

(65) Prior Publication Data

US 2014/0105421 A1    Apr. 17, 2014

(30) Foreign Application Priority Data

Oct. 15, 2012  (JP) ................................ 2012-228094

(51) Int. Cl.
*H03G 3/00*     (2006.01)
*H03G 7/00*     (2006.01)
*H03G 3/30*     (2006.01)

(52) U.S. Cl.
CPC .............. *H03G 7/00* (2013.01); *H03G 3/3005* (2013.01); *H03G 3/3089* (2013.01)

(58) Field of Classification Search
CPC ...... H03G 3/3005; H03G 3/3089; H03G 7/00
USPC ............. 381/1, 17, 18, 61, 74, 77, 79, 81, 82, 381/85, 104, 106–109, 300, 306, 307, 310, 381/311; 700/94
See application file for complete search history.

(56) References Cited

U.S. PATENT DOCUMENTS

| | | | |
|---|---|---|---|
| 9,053,710 B1* | 6/2015 | Zehr et al. | |
| 2008/0132339 A1* | 6/2008 | Taira | 463/43 |
| 2010/0056272 A1* | 3/2010 | Dutilly et al. | 463/30 |
| 2011/0293113 A1* | 12/2011 | McCarthy | 381/107 |
| 2012/0033530 A1* | 2/2012 | Enamito et al. | 367/99 |
| 2012/0165095 A1 | 6/2012 | Sato et al. | |

FOREIGN PATENT DOCUMENTS

JP    2012-135337    7/2012

* cited by examiner

*Primary Examiner* — Xu Mei
*Assistant Examiner* — Friedrich W Fahnert
(74) *Attorney, Agent, or Firm* — Nixon & Vanderhye PC

(57) ABSTRACT

An information processing apparatus generates a signal of a first sound to be output to a first output device, and a signal of a second sound which is a sound to be output to a second output device and whose content is different from that of the first sound. The second output device is capable of setting a volume, and outputs a sound based on the signal of the second sound at a set volume. In addition, the second output device notifies an information processing apparatus of information about the set volume. When the set volume is small, the information processing apparatus generates the signal of the first sound so that at least a part of sounds included in the second sound is included in the first sound.

14 Claims, 9 Drawing Sheets

F I G. 5
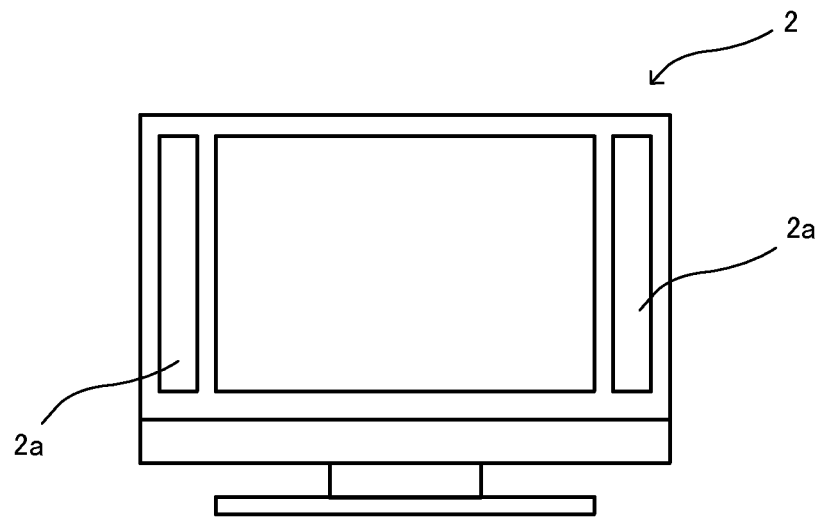
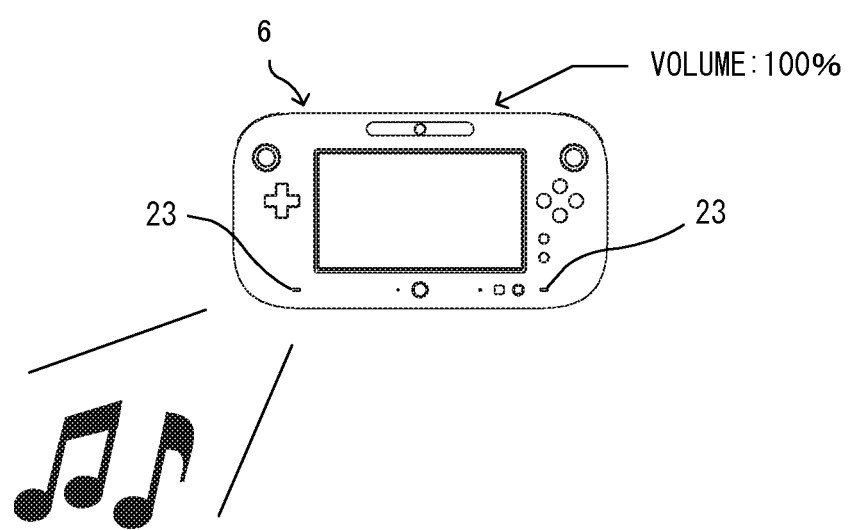

F I G. 6
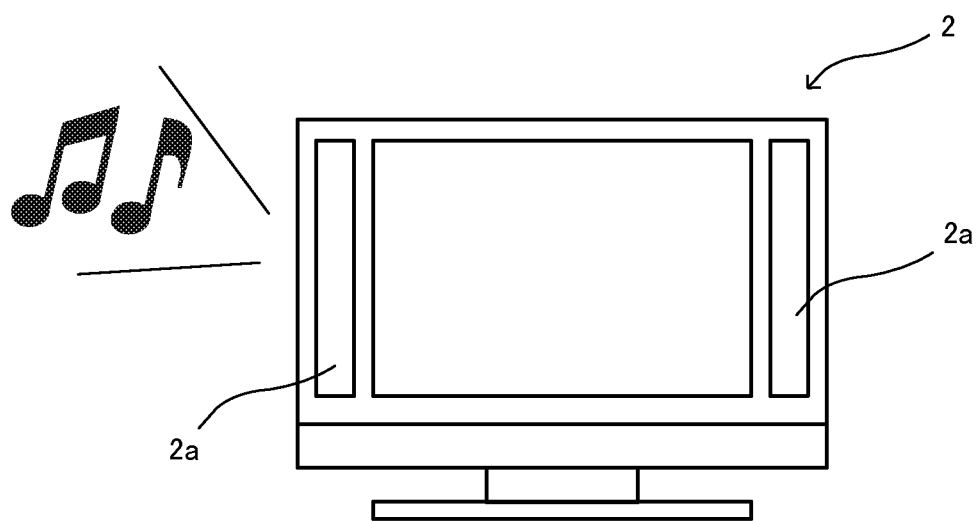
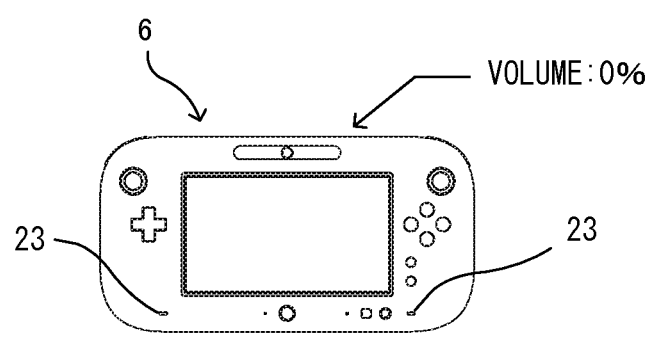

SOUND OUTPUT SYSTEM, NON-TRANSITORY COMPUTER-READABLE STORAGE MEDIUM HAVING SOUND OUTPUT PROGRAM STORED THEREON, SOUND OUTPUT CONTROL METHOD, AND INFORMATION PROCESSING APPARATUS

CROSS REFERENCE TO RELATED APPLICATION

The disclosure of Japanese Patent Application No. 2012-228094, filed on Oct. 15, 2012, is incorporated herein by reference.

FIELD

The exemplary embodiments relate to a sound output system, a non-transitory computer-readable storage medium having a sound output program stored thereon, a sound output control method, and an information processing apparatus, and more particularly, to those using a plurality of different sound output devices.

BACKGROUND AND SUMMARY

Conventionally, a game system has been known in which a general television device (first video output device) and a controller (second video output device) including a display section capable of video output, which is different from the first video output device, are used in combination. In such a game system, for example, a first game video is displayed on the television device, and a second game video different from the first game video is displayed on the display section of the controller, thereby proposing a new game.

However, the above-mentioned proposal has focused mainly on what kinds of videos are to be displayed and how to display the videos in relation to game processing. Therefore, processing relating to audio has not been neither mentioned nor proposed in particular.

Therefore, an object of the exemplary embodiments is to provide a sound output system capable of providing a user with a new game using sound output devices that are physically different from each other.

The above object is achieved by the following configurations, for example.

An exemplary configuration is a sound output system including an information processing apparatus, a first output device having a first sound output section, and a second output device having a second sound output section. The information processing apparatus includes a sound generation section configured to generate, based on predetermined information processing, a first sound signal to be output to the first output device, and a second sound signal that is a sound signal to be output to the second output device and having a sound content different from that of the first sound signal. The second output device includes: a volume setting section configured to set a volume; a second sound output control section configured to cause the second sound output section to output a second sound based on the second sound signal, at the volume set by the volume setting section; and a volume notification section configured to notify the information processing apparatus of information about the volume set by the volume setting section. The sound generation section generates the first sound signal so that at least a part of sounds included in the second sound is included in the first sound, when the volume set by the volume setting section is small. "When the volume set by the volume setting section is small" means a case where the volume of the sound outputted from the second sound output section is so small that the user cannot recognize the sound.

According to the above exemplary configuration, when there is a sound to be recognized by the user, it is possible to cause the user to reliably hear the sound.

In another exemplary configuration, the sound generation section may generate the first sound signal so that at least a part of sounds included in the second sound is included in the first sound, when the volume set by the volume setting section is equal to or smaller than a predetermined value. Alternatively, the sound generation section may generate the first sound signal so that at least a part of sounds included in the second sound is included in the first sound, when the volume set by the volume setting section is 0.

In still another exemplary configuration, the sound generation section may generate the first sound signal so that a playback volume of the second sound included in the first sound signal increases as the volume set by the volume setting section decreases, and the playback volume of the second sound included in the first sound signal decreases as the volume set by the volume setting section increases.

According to the above exemplary configurations, even when the user turns down the volume of the sound from the second output device so that it is inaudible, it is possible to cause the user to recognize the sound through the first output device.

In still another exemplary configuration, the first output device may further include a first display section, and the second output device may further include a second display section. The information processing apparatus may further include an image generation section configured to generate a first image to be displayed on the first display section, and a second image to be displayed on the second display section.

In still another exemplary configuration, the volume notification section may include an operation data generation section configured to generate operation data based on an operation performed by a user, and the information processing apparatus may further include a game processing section configured to perform game processing based on the operation data. The operation data generation section may generate the operation data including the information about the volume set by the volume setting section.

In still another exemplary configuration, the second sound may be a sound that needs to be reliably recognized by a user during execution of the predetermined information processing.

According to the above exemplary configurations, for example, in game processing, it is possible to provide a game utilizing a dramatic effect and the like caused by the sound outputted from only the second output device. In such game processing, even when the user turns down the volume of the sound from the second output device, it is possible to reduce degradation of the dramatic effect of the game sound that is intended by the game creator.

According to the exemplary embodiments, when a sound to be reliably heard by a user is used in predetermined information processing, it is possible to cause the user to reliably recognize such a sound.

BRIEF DESCRIPTION OF THE DRAWINGS

FIG. 5 is a diagram showing a non-limiting example of an output state of a game sound;

FIG. 6 is a diagram showing a non-limiting example of an output state of a game sound;

DETAILED DESCRIPTION OF NON-LIMITING EXAMPLE EMBODIMENTS

Figure 1:
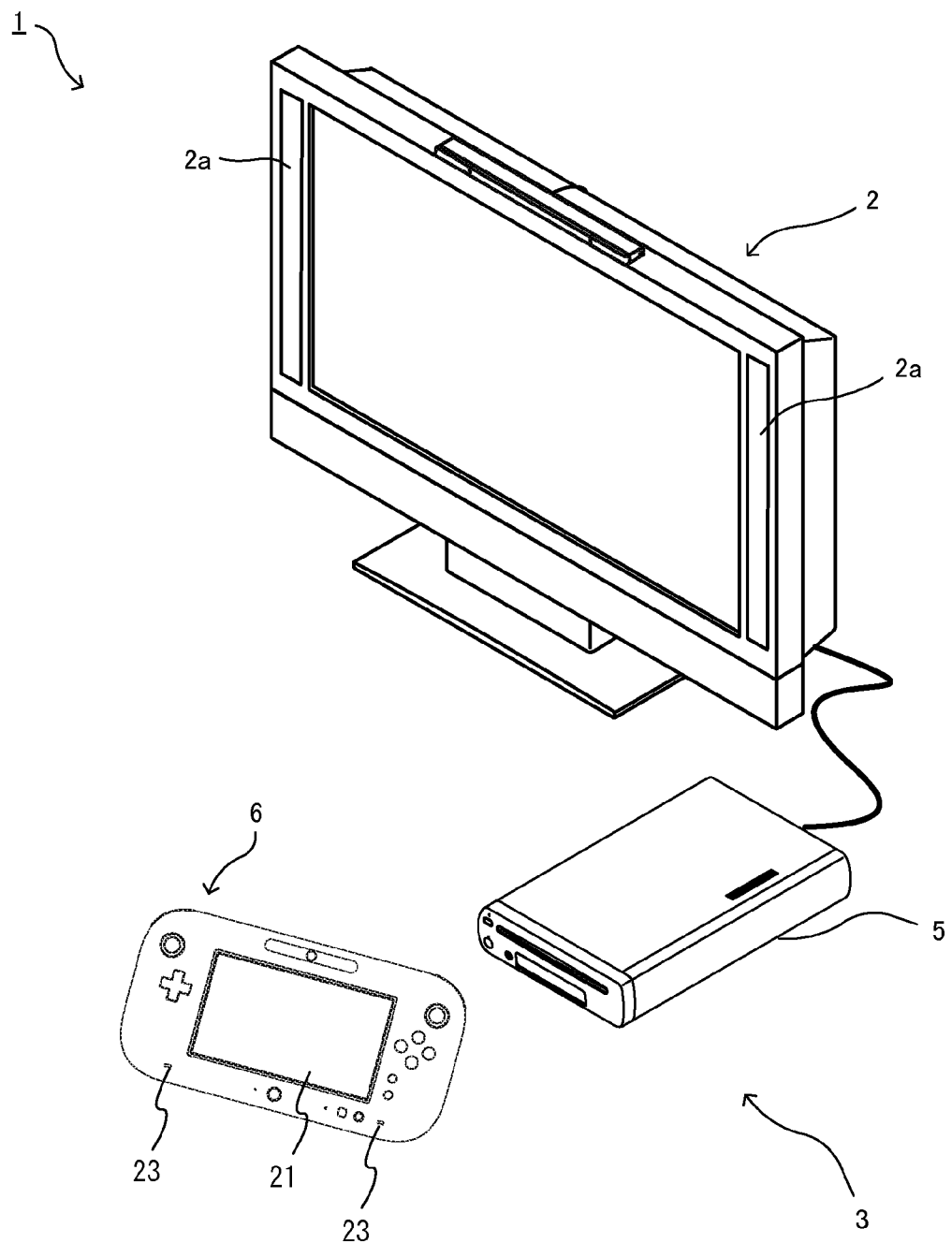
FIG. 1 is an external view showing a non-limiting example of a game system 1 according to an embodiment.

With reference to FIG. 1, a game system according to an exemplary embodiment will be described.

As shown in FIG. 1, a game system 1 includes a household television receiver (hereinafter, referred to as a monitor) 2 that is an example of display means, and a stationary game apparatus 3 connected to the monitor 2 via a connection cord. The monitor 2 includes loudspeakers 2a. The game apparatus 3 includes a game apparatus body 5, and a terminal device 6.

The monitor 2 displays a game image outputted from the game apparatus body 5. The monitor 2 includes the loudspeakers 2a, and the loudspeakers 2a each output a game sound outputted from the game apparatus body 5. In this exemplary embodiment, the monitor 2 includes the loudspeakers 2a. In another exemplary embodiment, external loudspeakers may be additionally connected to the monitor 2 (via an amplifier or the like).

The game apparatus body 5 executes game processing and the like based on a game program or the like stored in an optical disc that is readable by the game apparatus body 5.

The terminal device 6 is an input device that is small enough to be held by a user. The user is allowed to move the terminal device 6 with hands, or place the terminal device 6 at any location. The terminal device 6 includes an LCD (Liquid Crystal Display) 21 as display means, loudspeakers 23, a headphone jack described later, input means (analog sticks, press-type buttons, a touch panel, and the like), and the like. The terminal device 6 and the game apparatus body 5 are communicable with each other wirelessly (or via a cable). The terminal device 6 receives, from the game apparatus body 5, data of an image (e.g., a game image) generated in the game apparatus body 5, and displays the image represented by the data on the LCD 21. Further, the terminal device 6 receives, from the game apparatus body 5, data of a sound (e.g., a sound effect, BGM or the like of a game) generated in the game apparatus body 5, and outputs the sound represented by the data from the loudspeakers 23. Further, the terminal device 6 transmits, to the game apparatus body 5, operation data representing the content of an operation performed on the terminal device 6.

Figure 2:
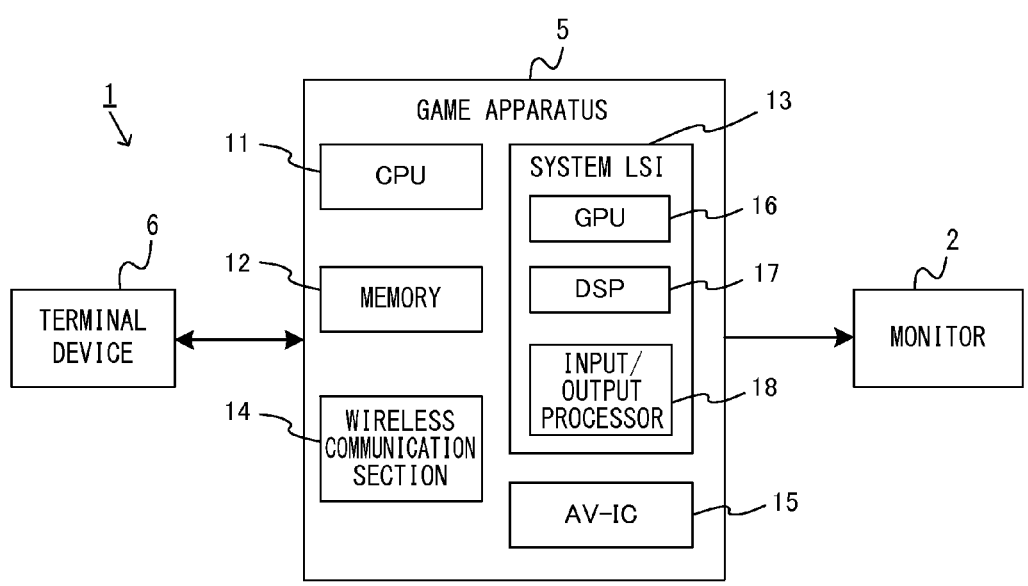
FIG. 2 is a functional block diagram showing a non-limiting example of a game apparatus body 5 in FIG. 1.

FIG. 2 is a block diagram showing the game apparatus body 5. In FIG. 2, the game apparatus body 5 is an example of an information processing apparatus. In the exemplary embodiment, the game apparatus body 5 includes a CPU (control section) 11, a memory 12, a system LSI 13, a wireless communication section 14, and an AV-IC (Audio Video-Integrated Circuit) 15, and the like.

The CPU 11 executes a predetermined information processing program by using the memory 12, the system LSI 13, and the like. Thereby, various functions (e.g., game processing) in the game apparatus 3 are realized.

The system LSI 13 includes a GPU (Graphics Processor Unit) 16, a DSP (Digital Signal Processor) 17, an input/output processor 18, and the like.

The GPU 16 generates an image in accordance with a graphics command (draw command) from the CPU 11. In the exemplary embodiment, the game apparatus body 5 may generate both a game image to be displayed on the monitor 2 and a game image to be displayed on the terminal device 6. Hereinafter, the game image to be displayed on the monitor 2 may be referred to as a "monitor game image", and the game image to be displayed on the terminal device 6 may be referred to as a "terminal game image".

The DSP 17 serves as an audio processor, and generates sound data by using sound data and sound waveform (tone quality) data stored in the memory 12. In the exemplary embodiment, similarly to the game images, both a game sound to be output from the loudspeakers 2a of the monitor 2 and a game sound to be output from the loudspeakers 23 of the terminal device 6 may be generated. Hereinafter, the game sound to be output from the monitor 2 may be referred to as a "monitor game sound", and the game sound to be output from the terminal device 6 may be referred to as a "terminal game sound".

The input/output processor 18 executes transmission and reception of data with the terminal device 6 via the wireless communication section 14. In the exemplary embodiment, the input/output processor 18 transmits data of the game image (terminal game image) generated by the GPU 16 and data of the game sound (terminal game sound) generated by the DSP 17, via the wireless communication section 14 to the terminal device 6. At this time, the terminal game image may be compressed and transmitted so as to avoid a delay in the display image. In addition, the input/output processor 18 receives, via the wireless communication section 14, operation data and the like transmitted from the terminal device 6, and (temporarily) stores the data in a buffer region of the memory 12.

Of the images and sounds generated in the game apparatus body 5, the image data and sound data to be output to the monitor 2 are read by the AV-IC 15. Through an AV connector that is not shown, the AV-IC 15 outputs the read image data to the monitor 2, and outputs the read sound data to the loudspeakers 2a included in the monitor 2. Thereby, an image is displayed on the monitor 2, and a sound is output from the loudspeakers 2a.

Figure 3:
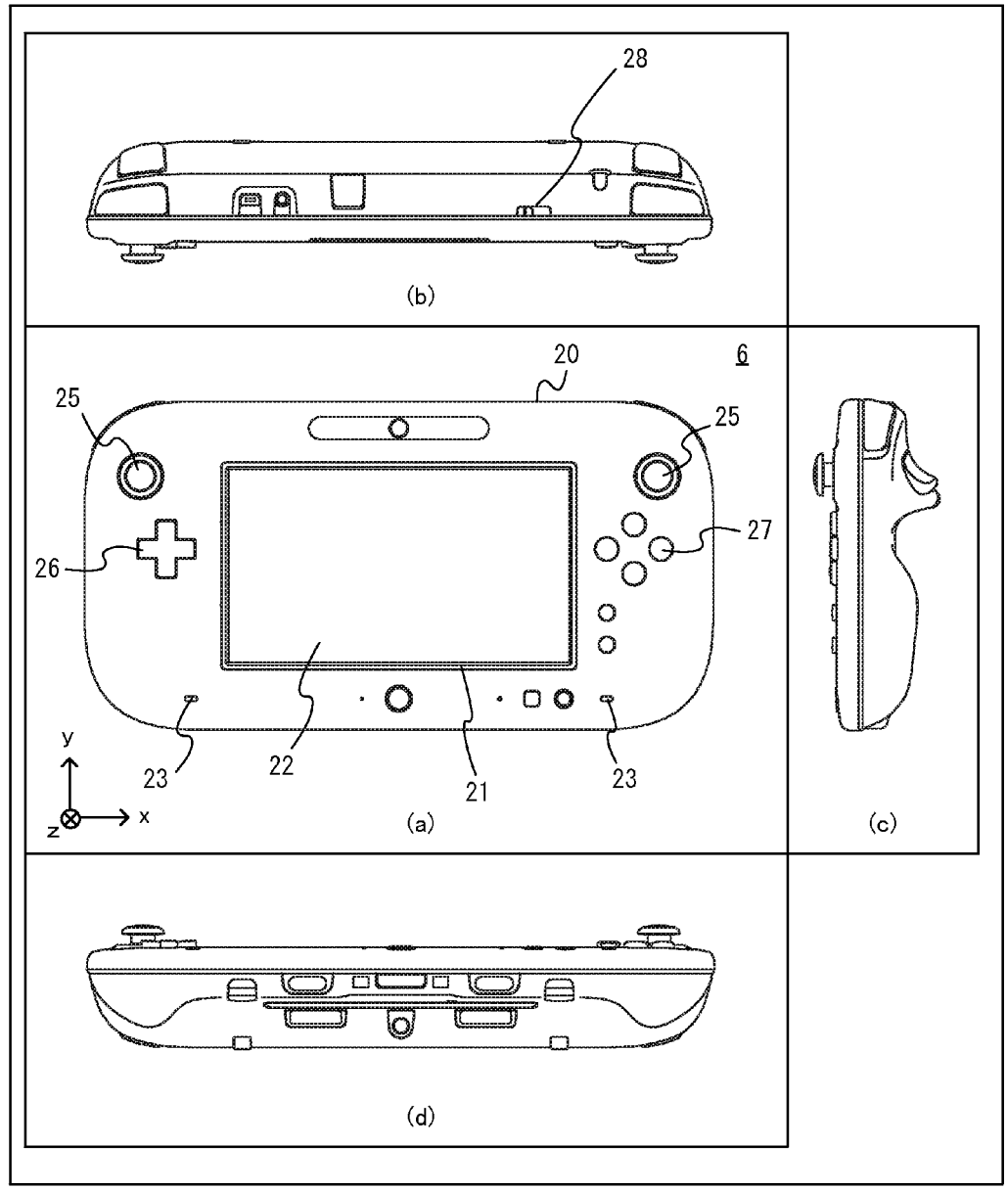
FIG. 3 is a diagram showing a non-limiting example of an external structure of a terminal device 6 in FIG. 1.

FIG. 3 is a diagram showing an example of an external structure of the terminal device 6. As shown in FIG. 3, the terminal device 6 includes a substantially plate-shaped housing 20. The size (shape) of the housing 20 is small enough to be held by a user with both hands or one hand. Further, the terminal device 6 includes an LCD 21 as an example of a display section. The above-mentioned terminal game image is displayed on the LCD 21.

The terminal device 6 includes the loudspeakers 23. The above-mentioned terminal game sound is output from the loudspeakers 23. Further, the terminal device 6 includes a volume control slider 28 for controlling the volume of the loudspeakers 23. The volume control slider 28 is a slider switch.

The terminal device 6 includes a touch panel 22. The touch panel 22 is an example of a position detection section for detecting a position of an input performed on a predetermined input surface (a screen of the display section) provided on the housing 20. Further, the terminal device 6 includes, as an operation section (an operation section 31 shown in FIG. 4), analog sticks 25, a cross key 26, buttons 27, and the like.

Figure 4:
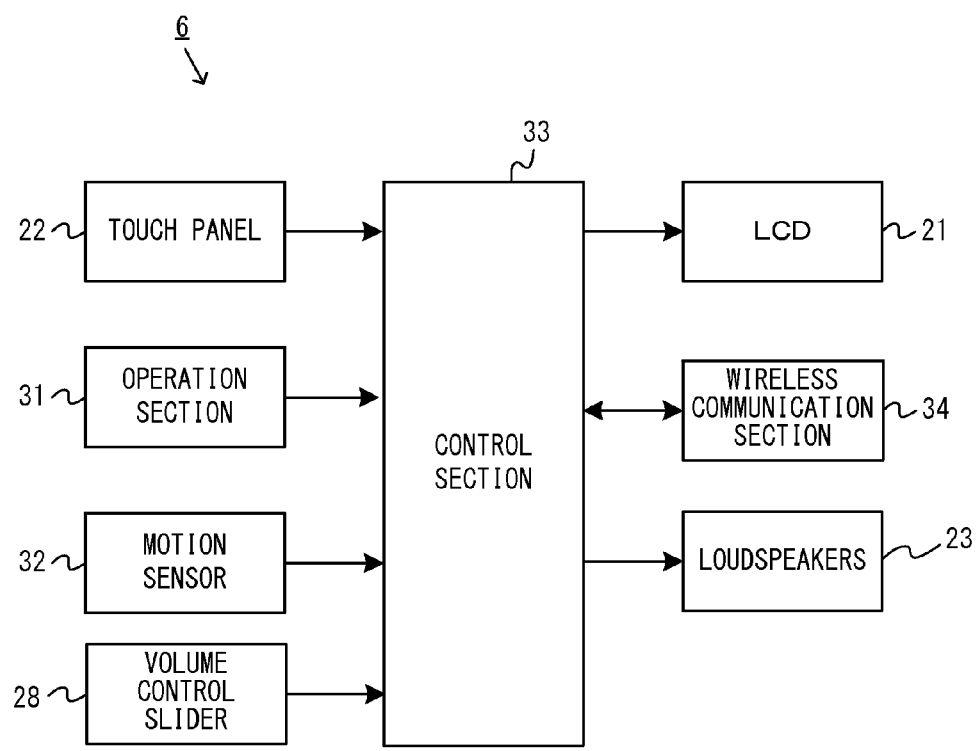
FIG. 4 is a block diagram showing a non-limiting example of an internal structure of the terminal device 6.

FIG. 4 is a block diagram showing an electrical configuration of the terminal device 6. As shown in FIG. 4, the terminal device 6 includes the above-mentioned LCD 21, touch panel 22, loudspeakers 23, volume control slider 28, and operation section 31. Further, the terminal device 6 includes a motion sensor 32 (e.g., an acceleration sensor or a gyro sensor) for detecting the attitude of the terminal device 6.

The terminal device 6 includes a wireless communication section 34 capable of wirelessly communicating with the game apparatus body 5. In the exemplary embodiment, wireless communication is performed between the terminal device 6 and the game apparatus body 5. In another exemplary embodiment, wired communication may be performed.

The terminal device 6 includes a control section 33 for controlling operations in the terminal device 6. Specifically, the control section 33 receives output data from the respective input sections (the touch panel 22, the operation section 31, and the motion sensor 32). Then, the terminal device 6 transmits the received data, as operation data, via the wireless communication section 34 to the game apparatus body 5. When the terminal game image from the game apparatus body 5 is received by the wireless communication section 34, the control section 33 performs, according to need, appropriate processes (e.g., decompression if the image data is compressed), and causes the LCD 21 to display the image from the game apparatus body 5. Further, when the terminal game sound from the game apparatus body 5 is received by the wireless communication section 34, the control section 33 outputs the terminal game sound to the loudspeakers 23.

Next, an overview of game processing executed in the system of the exemplary embodiment will be described with reference to FIGS. 5 and 6.

In the exemplary embodiment, as shown in FIG. 5, game processing is assumed in which a predetermined game sound is basically output as only a terminal game sound. That is, the exemplary embodiment assumes that the game sound is properly output from either the loudspeakers 2a of the monitor 2 or the loudspeakers 23 of the terminal device 6, in view of dramatic effect in a game, for example. In addition, when a user is playing a game, the terminal device 6 held by the user is basically closer to (the ear of) the user than the monitor 2. Therefore, outputting the game sound from only the loudspeakers 23 enables the user to reliably recognize the game sound. For example, outputting the game sound from the loudspeakers 23 is useful when causing the user to notice the screen of the terminal device 6, when calling the user's attention to something, or when emphasizing the reality or the like of a virtual 3D game. Hereinafter, such a game sound outputted as only a terminal game sound may be referred to as a "sound specific to terminal".

Examples of the sound specific to terminal are as follows. First, game processing using two screens, i.e., the monitor 2 and the LCD 21 of the terminal device 6, is assumed. For example, on the monitor 2, a user character and an enemy character are displayed. On the other hand, on the LCD 21, various kinds of status information such as hit points and life points of the user character are displayed. In this game, basically, the user plays while viewing the monitor 2 (for example, the user plays a game in which the user character fights with a plurality of enemy characters in a one-to-many situation). Then, for example, when the hit points or life points of the user character are significantly reduced, a sound effect (warning sound) for warning the user that the user character is in a pinch is outputted as a sound specific to terminal. Thus, the warning sound reliably calls the user's attention. Alternatively, in another example, in game processing in which a user character moves in a virtual 3D space, if it rains in the virtual 3D space, the sound of rain is outputted from only the terminal device 6 as a sound specific to terminal, thereby enhancing the reality in the virtual 3D space. In still another example, game processing is assumed in which a user character moves in a virtual 3D space and fights with a plurality of enemy characters. Then, in such a game, it is assumed that there is an enemy character behind the user character (the enemy character is not displayed on the screen and therefore is invisible for the user). In such a case, the sound of the enemy character existing behind the user character is output from only the terminal device 6 as a sound specific to terminal, thereby calling the user's attention.

By the way, the terminal device 6 includes the volume control slider 28. Therefore, by operating the volume control slider 28, the user can control the output volume on the loudspeakers 23 at real time even during game play. If the user sets the volume to 0, the sound from the loudspeakers 23 of the terminal device 6 becomes inaudible for the user. As a result, the sound specific to terminal, which has been output from the terminal device 6 side, also becomes inaudible for the user. Then, dramatic effect and/or fun of the game, which are intended by the game developer, might be degraded.

Therefore, in the exemplary embodiment, as shown in FIG. 6, when the volume is set to 0 by the volume control slider 28 (i.e., when the sound from the loudspeakers 23 is inaudible), control is performed such that the sound specific to terminal, which has been output from only the terminal device 6 side, is output from the monitor 2 side. Thereby, for example, the user is prevented from failing to hear the warning sound outputted when the user character is in a pinch, and thus degradation in the fun of the game and the like can be reduced.

For convenience sake, in the following description, the terminal game sound is equal to the sound specific to terminal. However, in another exemplary embodiment, the terminal game sound may be composed of various sounds including the sound specific to terminal. For example, the terminal game sound may include a sound effect A and a sound effect B, and only the sound effect B may be the sound specific to terminal. In this case, when the volume is set to 0, only the sound effect B is output from the loudspeakers 2a of the monitor 2, and the sound effect A is not output from the loudspeakers 2a of the monitor 2. In other words, only a part of the sounds included in the terminal game sound may be output from the monitor side.

Next, an operation of the game system to realize the above-mentioned game processing will be described with reference to FIGS. 7 to 10.

Figure 7:
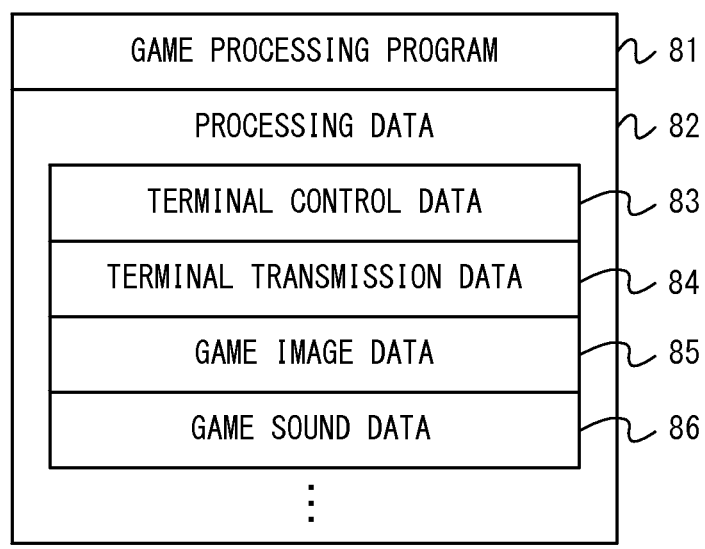
FIG. 7 is a memory map of a memory 12.

FIG. 7 shows an example of various data stored in the memory 12 of the game apparatus body 5 when executing the above-mentioned game processing.

A game processing program 81 is a program for causing the CPU 11 of the game apparatus body 5 to execute the game processing to realize the above-mentioned game. For example, the game processing program 81 is loaded from an optical disc to the memory 12.

Processing data 82 is data used for the game processing executed by the CPU 11. The processing data 82 includes terminal operation data 83, terminal transmission data 84, game image data 85, game sound data 86, and the like.

Figure 8:
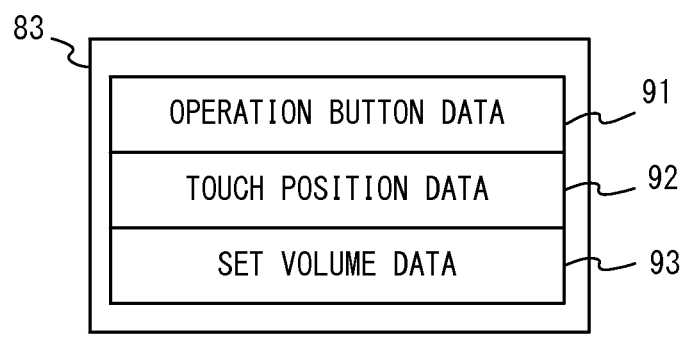
FIG. 8 is a non-limiting example of a structure of terminal operation data 83.

The terminal operation data 83 is operation data periodically transmitted from the terminal device 6. FIG. 8 is a diagram showing an example of a structure of the terminal operation data 83. The terminal operation data 83 includes operation button data 91, touch position data 92, set volume data 93, and the like. The operation button data 91 is data representing an input state to the operation section 31 (the analog sticks 25, the cross key 26, and the buttons 27). In addition, the operation button data 91 also includes the content of an input to the motion sensor 32. The touch position data 92 is data representing a position (touch position) where an input is performed on the input surface of the touch panel 22. The set volume data 93 is data representing a volume value set by the volume control slider 28 being operated by the user. For example, the volume value is indicated in 256 levels from 0 to 255.

The terminal transmission data 84 is data periodically transmitted to the terminal device 6. The terminal transmission data 84 includes the above-mentioned terminal game image and terminal game sound.

The game image data 85 is data which is an origin of the terminal game image and the monitor game image. For example, the game image data 85 includes data of various 3D objects that appear in the virtual game space, and the like.

The game sound data 86 is data which is an origin of the terminal game sound and the monitor game sound. The game sound data 86 includes at least one piece of sound effect data or BGM data. Each of these data may be, for example, an audio file of ADPCM or MP3 format, or music score data that can be played by a sound source included in the game apparatus body 5.

Figure 9:
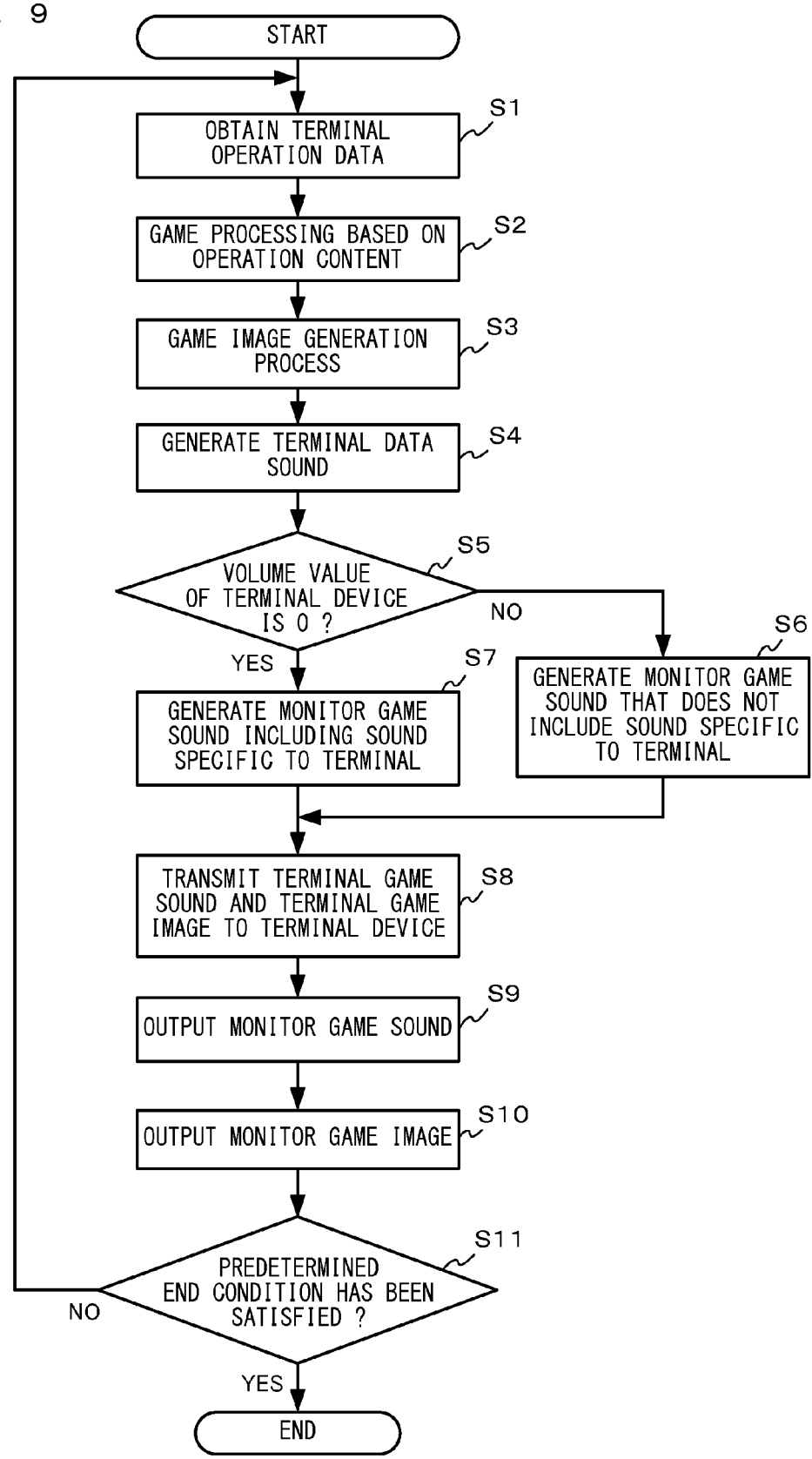
FIG. 9 is a flowchart showing a flow of game processing based on game processing program 81.

Next, an exemplary flow of the game processing performed by the CPU 11 of the game apparatus body 5 based on the game processing program 81 will be described with reference to the flowchart of FIG. 9.

When execution of the game processing program 81 is started, a predetermined initialization process is performed. Thereafter, the CPU 11 obtains the terminal operation data 83 in step S1 in FIG. 8.

Next, in step S2, the CPU 11 executes predetermined game processes based on the operation content represented by the terminal operation data 83 (mainly, the operation content represented by the operation button data 91 and/or the touch position data 92). For example, the CPU 11 executes a process of moving various characters and objects such as a user character, a hitting determination process, a score addition process, and the like.

Next, in step S3, the CPU 11 executes a process of generating a game image in which the results of the above-mentioned game processes are reflected. For example, a game image is generated by taking, using a virtual camera, the virtual game space in which the user character has been moved based on the operation content. At this time, the CPU 11 appropriately generates both a monitor game image and a terminal game image in accordance with the game content. Specifically, the two images are generated by using two virtual cameras, respectively.

Next, in step S4, the CPU 11 generates a terminal game sound (in the exemplary embodiment, it is also a sound specific to terminal) in which the results of the game processes are reflected, based on (predetermined sound effect data or BGM data included in) the game sound data 86.

Next, in step S5, the CPU 11 determines whether or not the volume value on the terminal device 6 side is 0, with reference to the set volume data 93 in the terminal operation data 83. Upon determining that the volume value is not 0 (NO in step S5), the CPU 11 generates, in step S6, a monitor game sound in which the results of the game processes are reflected, based on the game sound data 86. At this time, the monitor game sound is generated so as not to include the sound specific to terminal. Thereafter, the CPU 11 goes to step S8.

On the other hand, when determining in step S5 that the volume on the terminal device 6 side is set to 0 (YES in step S5), the CPU 11 generates a monitor game sound. At this time, the CPU 11 generates the monitor game sound so as to include the sound specific to terminal. For example, a process of reproducing the sound specific to terminal is performed with the volume of the sound specific to terminal being set to a predetermined value other than 0, and the reproduced sound is mixed with the monitor game sound.

Next, in step S8, the CPU 11 stores the terminal game image generated in step S3 and the terminal game sound generated in step S5, in the terminal transmission data 84. Then, the CPU 11 transmits the terminal transmission data 84 to the terminal device 6. Thereby, in the terminal device 6, a predetermined game image and a predetermined game sound are output.

Next, in step S9, the CPU 11 outputs the monitor game sound. At this time, if the volume value on the terminal device 6 side is not 0 (NO in step S5), the monitor game sound in which the sound specific to terminal is not included comes from the loudspeakers 2*a*. On the other hand, if the volume value on the terminal device 6 side is 0 (YES in step S5), the monitor game sound in which the sound specific to terminal is included comes from the loudspeakers 2*a*.

Next, in step S10, the CPU 11 outputs the monitor game image generated in step S3 to the monitor 2.

Next, in step S11, the CPU 11 determines whether or not a predetermined condition to end the game processing has been satisfied. Upon determining that the condition has not been satisfied (NO in step S11), the CPU 11 returns to step S1 to repeat the above-mentioned process steps. Upon determining that the condition has been satisfied (YES in step S11), the CPU 11 ends the game processing.

Figure 10:
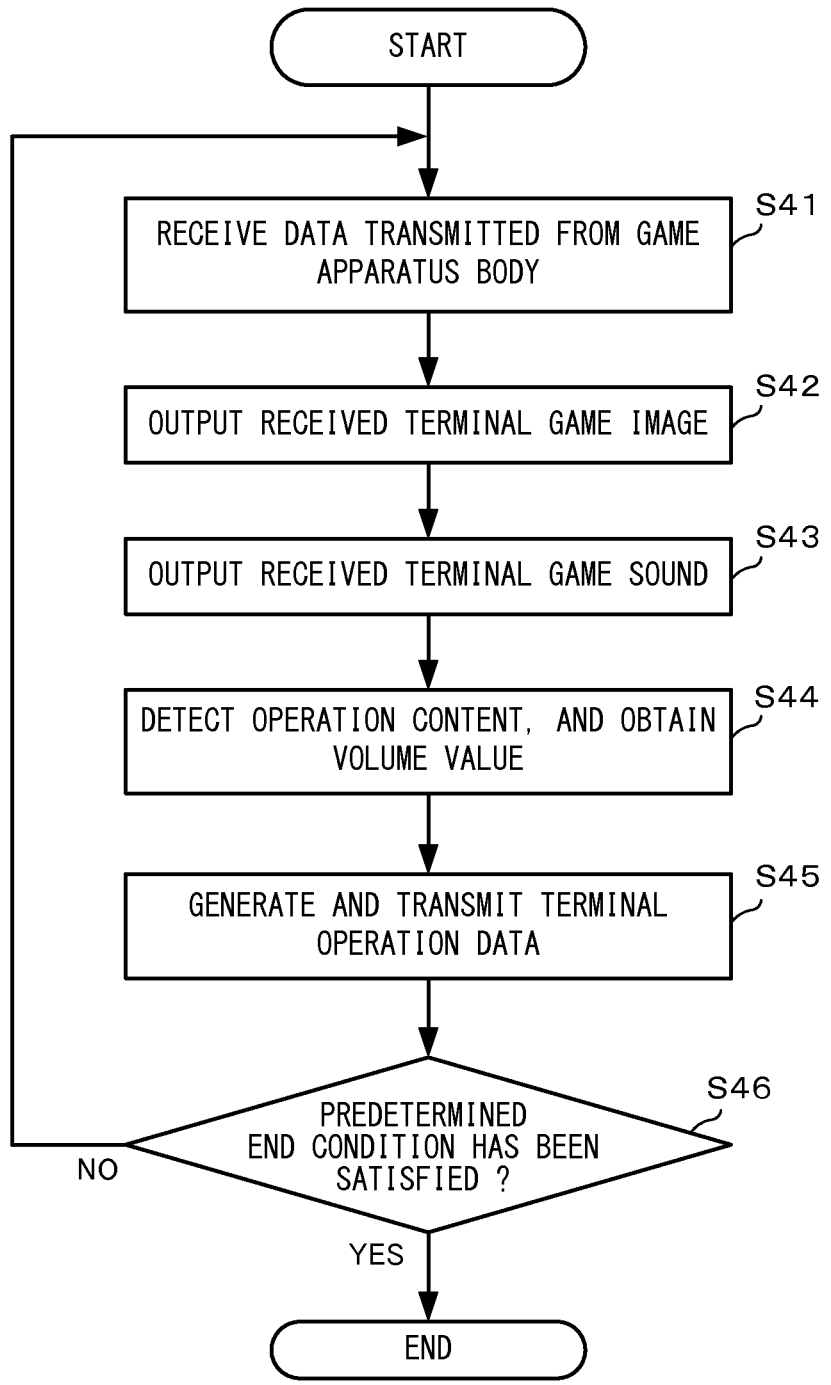
FIG. 10 is a flowchart showing a flow of control processing of the terminal device 6.

Next, an exemplary flow of a control process performed by the control section 33 of the terminal device 6 will be described with reference to the flowchart of FIG. 10. First, in step S41, the control section 33 receives the terminal transmission data 84 transmitted from the game apparatus body 5.

Next, in step S42, the control section 33 outputs, to the LCD 21, a terminal game image included in the received terminal transmission data 84.

Next, in step S43, the control section 33 outputs, to the loudspeakers 23, a sound signal based on data of the terminal game sound included in the received terminal transmission data 84. However, the volume of the sound signal depends on the value set by the volume control slider 28. Therefore, if the volume is 0, actually no sound comes from the loudspeakers 23 although the sound signal itself is output to the loudspeakers 23.

Next, in step S44, the control section 33 detects inputs (operation contents) to the operation section 31, the motion sensor 32, and the touch panel 22, and generates operation button data 91 and touch position data 92. Further, the control section 33 obtains the volume value set by the volume control slider 28 at that time. Then, the control section 33 generates set volume data 93 based on the set volume value.

Next, in step S45, the control section 33 generates terminal operation data 83 including the operation button data 91, the touch position data 92, and the set volume data 93, which have been generated in step S44, and transmits the terminal operation data 83 to the game apparatus body 5.

Next, in step S46, the control section 33 determines whether or not a predetermined condition to end the control process of the terminal device 6 has been satisfied (e.g., whether or not a power-off operation has been performed). Upon determining that the condition has not been satisfied (NO in step S46), the control section 33 returns to step S41 to repeat the above-mentioned process steps. Upon determining that the condition has been satisfied (YES in step S46), the control section 33 ends the control process of the terminal device 6.

As described above, according to the configuration of the exemplary embodiment, when performing information processing to output a sound from only the terminal device 6 side, even if the volume value on the terminal device 6 side is set to 0, the sound can be output from the monitor 2 side. Thereby, the user is prevented from failing to hear the sound. That is, when a sound that the user needs to hear in spite of the volume on the terminal device 6 side being 0 is used in the above-mentioned information processing, it is possible to cause the user to hear the sound.

(Modifications)

In the exemplary embodiment, the sound specific to terminal is output from the monitor 2 side when the volume on the terminal device 6 side is 0. Alternatively, also when the volume on the terminal device 6 side is not 0 but equal to or smaller than a predetermined value, the sound specific to terminal may be output from the monitor 2 side. The predetermined value is desirably a volume value at or below which the user cannot recognize the sound. That is, also when the volume is reduced to a value which is not 0 but at which the user substantially cannot hear the sound, the sound specific to terminal may be output from the monitor 2 side.

Further, regarding the sound specific to terminal, the tone quality thereof may be varied between when it is output from the loudspeakers 23 of the terminal device 6 and when it is output from the loudspeakers 2a of the monitor 2. That is, the sound specific to terminal may be output in accordance with the characteristics of the loudspeakers 2a of the monitor 2 and the loudspeakers 23 of the terminal device 6. For example, the tone quality of a sound specific to terminal may be higher when it is output from the monitor 2 than when it is output from the terminal device 6. More specifically, for a sound specific to terminal, two types of data, i.e., sound data of a low bit rate (low-sound-quality data, e.g., MP3 data of 128 kbps) and sound data of a high bit rate (high-sound-quality data, e.g., MP3 data of 320 kbps), are prepared. When generating a terminal game sound (the process in step S4), a sound specific to terminal is generated by using the low-sound-quality data. On the other hand, when including a terminal sound in a monitor game sound (the process in step S7), a terminal sound is generated by using the high-sound-quality data, and then the terminal sound is included in the monitor game sound.

Alternatively, a control may be performed such that the playback volume of the sound specific to terminal on the monitor 2 side is increased as the volume on the terminal device 6 side is decreased. That is, the playback volume of the sound specific to terminal in the monitor game sound may be increased (gradually becomes audible) as the volume value set by the volume control slider 28 of the terminal device 6 approaches 0. The playback volume of the sound specific to terminal in the monitor game sound may be gradually decreased (gradually becomes inaudible) as the volume value set by the volume control slider 28 of the terminal device 6 approaches 255 (the maximum value).

The above-mentioned processes are applicable not only to game processing but to any other information processing in which a predetermined sound is output from only loudspeakers of a terminal device having a switch for controlling the volume of the sound.

Further, in the exemplary embodiment, a case has been described where the series of processes of outputting or not outputting the sound specific to terminal from the monitor side based on the volume value set on the terminal device 6 are executed on a single apparatus (the game apparatus body 5).

However, in another exemplary embodiment, the series of processes may be executed in an information processing system including a plurality of information processing apparatuses. For example, in an information processing system which includes the game apparatus body 5 and a server-side apparatus communicable with the game apparatus body 5 via a network, part of the series of processes may be executed on the server-side apparatus. Further, in the information processing system, the system on the server side may be configured with a plurality of information processing apparatuses, and processes to be executed on the server side may be shared and performed by the plurality of information processing apparatuses.

What is claimed is:

1. A sound output system including an information processing apparatus, a first output device having a first sound output section, and a second output device having a second sound output section, wherein the information processing apparatus includes at least one processor and is configured to:
generate, based on predetermined information processing, a first sound signal to be output to the first output device, and a second sound signal that is a sound signal to be output to the second output device and having a sound content different from that of the first sound signal, and the second output device including at least one processor and is configured to:
set a volume for the second sound output section;
output, by the second sound output section, a second sound based on the generated second sound signal, at the set volume; and
notify the information processing apparatus of information about the set volume, wherein
the first sound signal is generated so that at least a part of sounds included in the second sound is included in the first sound, when the set volume is small.

2. The sound output system according to claim 1, wherein the first sound signal is generated so that at least a part of sounds included in the second sound is included in the first sound, when the set volume is equal to or smaller than a predetermined value.

3. The sound output system according to claim 1, wherein the first sound signal is generated so that at least a part of sounds included in the second sound is included in the first sound, when the set volume is 0.

4. The sound output system according to claim 1, wherein the first sound signal is generated so that a playback volume of the second sound included in the first sound signal increases as the set volume decreases, and the playback volume of the second sound included in the first sound signal decreases as the set volume increases.

5. The sound output system according to claim 1, wherein
the first output device further includes a first display,
the second output device further includes a second display, and
the information processing apparatus is further configured to generate a first image to be displayed on the first display, and a second image to be displayed on the second display.

6. The sound output system according to claim 1, wherein
the second output device is further configured to generate operation data based on an operation performed by a user,
the information processing apparatus is further configured to perform game processing based on the operation data received from the second output device, and the generated operation data includes the information about the set volume set.

7. The sound output system according to claim 1, wherein the second sound is a sound that needs to be reliably recognized by a user during execution of the predetermined information processing.

8. A non-transitory computer-readable storage medium having stored thereon a sound output control program executed by a computer of a sound output system including an information processing apparatus, a first output device having a first sound output section, and a second output device having a second sound output section, the sound output control program, when executed, causing the computer to at least:
   cause the information processing apparatus to generate, based on predetermined information processing, a first sound signal to be output to the first output device, and a second sound signal that is a sound signal to be output to the second output device and having a sound content different from that of the first sound signal;
   set a volume of the second sound output section;
   cause the second sound output section to output a second sound based on the second sound signal, at the set volume; and
   notify the information processing apparatus of information about the set volume, wherein
   the first sound signal is generated so that at least a part of sounds included in the second sound is included in the first sound, when the set volume is small.

9. A sound output control method of controlling a sound output system including an information processing apparatus, a first output device having a first sound output section, and a second output device having a second sound output section, the method comprising:
   a sound generation step of generating, based on predetermined information processing, a first sound signal to be output to the first output device, and a second sound signal that is a sound signal to be output to the second output device and having a sound content different from that of the first sound signal;
   a volume setting step of causing the second output device to set a volume of the second sound output section;
   a second sound output control step of causing the second sound output section to output a second sound based on the second sound signal, at the volume set in the volume setting step; and
   a volume notification step of notifying information about the volume set in the volume setting step, from the second output device to the information processing apparatus, wherein
   the sound generation step generates the first sound signal so that at least a part of sounds included in the second sound is included in the first sound, when the volume set in the volume setting step is small.

10. An information processing apparatus comprising a processing system including at least one processor, the processing system being configured to at least:
    generate, based on predetermined information processing, a first sound signal and a second sound signal having a sound content different from that of the first sound signal;
    transmit the generated first sound signal to a first output device to output a sound based on the first sound signal;
    transmit the generated second sound signal to a second output device to output a sound based on the second sound signal; and
    receive, from the second output device, information about volume set for the sound output by the second output device, wherein
    the first sound signal is generated so that at least a part of sounds included in the second sound signal is included in the first sound signal, when the received information about the volume set for the sound output by the second output device indicates that the set volume is small.

11. The information processing apparatus of claim 10, wherein:
    when the received information about the volume set for the sound output by the second output device indicates that the set volume is greater than the a predetermined value, the first sound signal is generated so that the first sound signal does not include sound content of the generated second sound signal, and
    when the received information about the volume set for the sound output by the second output device indicates that the set volume is equal to or smaller than a predetermined value, the first sound signal is generated so that the first sound signal includes the sound content of the generated second sound signal.

12. The information processing apparatus of claim 11, wherein the second sound signal is generated with a bit rate that is lower than a bit rate of the generated first sound signal.

13. The information processing apparatus of claim 10, wherein:
    when the received information about the volume set for the sound output by the second output device indicates that the set volume is greater than the a predetermined value, the first sound signal is generated so that the first sound signal does not include sound content of the generated second sound signal, and
    when the received information about the volume set for the sound output by the second output device indicates that the set volume is equal to or smaller than a predetermined value, the first sound signal is generated so that the first sound signal includes sound content of the first sound signal mixed with only a portion of the sound content of the generated second sound signal.

14. The information processing apparatus of claim 10, wherein:
    when the received information about the volume set for the sound output by the second output device indicates that the set volume is gradually reduced, the first sound signal is generated so that the first sound signal includes sound content of the first sound signal and the sound content of the generated second sound signal and wherein the volume level of the sound content of the second sound signal that is included in the first sound signal is gradually increased in accordance with the reduction of the set volume.

* * * * *